US010593657B2

(12) United States Patent
Wu et al.

(10) Patent No.: US 10,593,657 B2
(45) Date of Patent: Mar. 17, 2020

(54) DISPLAY DEVICES AND METHODS FOR FORMING THE SAME

(71) Applicant: InnoLux Corporation, Miao-Li County (TW)

(72) Inventors: Yuan-Lin Wu, Miao-Li County (TW); Yu-Hsien Wu, Miao-Li County (TW); Kuan-Feng Lee, Miao-Li County (TW); Tsung-Han Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/642,599

(22) Filed: Jul. 6, 2017

(65) Prior Publication Data

US 2018/0122786 A1    May 3, 2018

Related U.S. Application Data

(60) Provisional application No. 62/479,326, filed on Mar. 31, 2017, provisional application No. 62/415,542, filed on Nov. 1, 2016.

(51) Int. Cl.
*H01L 25/16* (2006.01)
*H01L 25/075* (2006.01)
(Continued)

(52) U.S. Cl.
CPC ............ *H01L 25/167* (2013.01); *H01L 24/29* (2013.01); *H01L 25/075* (2013.01);
(Continued)

(58) Field of Classification Search
CPC ..................................................... H01L 25/167
See application file for complete search history.

(56) References Cited

U.S. PATENT DOCUMENTS 9,627,594 B2      4/2017  Maki
2004/0080680 A1*  4/2004  Kim .................. G02F 1/136204
                                                            349/43

(Continued)

FOREIGN PATENT DOCUMENTS

CN      105051923 A     11/2015
EP      2 980 871 A1    2/2016
WO      2014/140796 A1  9/2014

OTHER PUBLICATIONS

European Search Report dated Mar. 27, 2018, issued in application No. 17191515.0.

(Continued)

*Primary Examiner* — Eugene Lee
(74) *Attorney, Agent, or Firm* — McClure, Qualey & Rodack, LLP

(57) ABSTRACT

A display device is provided. The display device includes a supporting film and a flexible substrate disposed on the supporting film. The display device also includes a driving layer disposed on the flexible substrate, and a conductive pad disposed on the driving layer. The display device further includes a light-emitting diode disposed on the conductive pad and electrically connected to the conductive pad, wherein the supporting film has a first hardness, the flexible substrate has a second hardness, and the first hardness is greater than or equal to the second hardness.

11 Claims, 16 Drawing Sheets

(51) Int. Cl.
*H01L 23/00* (2006.01)
*H01L 27/12* (2006.01)
*H01L 33/62* (2010.01)

(52) U.S. Cl.
CPC ...... *H01L 25/0753* (2013.01); *H01L 27/1218* (2013.01); *H01L 27/1248* (2013.01); *H01L 33/62* (2013.01); *H01L 27/124* (2013.01); *H01L 2224/29499* (2013.01); *H01L 2224/32148* (2013.01); *H01L 2924/12041* (2013.01); *H01L 2924/1426* (2013.01); *H01L 2933/0033* (2013.01); *H01L 2933/0066* (2013.01)

(56) References Cited

U.S. PATENT DOCUMENTS

| | | | | | |
|---|---|---|---|---|---|
| 2004/0141130 | A1* | 7/2004 | Kawata | ............ | G02F 1/136209 349/139 |
| 2005/0116623 | A1* | 6/2005 | Kim | ............ | H01L 27/3244 313/504 |
| 2012/0112215 | A1* | 5/2012 | Chai | ............ | H01L 25/0753 257/89 |
| 2012/0112220 | A1* | 5/2012 | West | ............ | H01L 33/46 257/98 |
| 2012/0187430 | A1* | 7/2012 | West | ............ | H01L 25/0753 257/88 |
| 2012/0299022 | A1* | 11/2012 | Hussell | ............ | H01L 25/0753 257/88 |
| 2013/0050103 | A1* | 2/2013 | Song | ............ | G06F 3/041 345/173 |
| 2013/0126915 | A1* | 5/2013 | Chan | ............ | H01L 51/5253 257/88 |
| 2014/0027792 | A1* | 1/2014 | Iwasaki | ............ | H01L 33/08 257/88 |
| 2014/0151652 | A1* | 6/2014 | Im | ............ | H01L 51/5228 257/40 |
| 2014/0159064 | A1* | 6/2014 | Sakariya | ............ | H01L 25/0753 257/88 |
| 2014/0217397 | A1* | 8/2014 | Kwak | ............ | H01L 27/1218 257/43 |
| 2015/0303389 | A1* | 10/2015 | Kim | ............ | H01L 51/0097 257/40 |
| 2016/0043153 | A1* | 2/2016 | Min | ............ | H01L 51/0097 257/40 |
| 2016/0190105 | A1* | 6/2016 | Rhee | ............ | H01L 25/0753 257/76 |
| 2016/0351548 | A1* | 12/2016 | Chen | ............ | H01L 22/20 |
| 2017/0062492 | A1* | 3/2017 | Bae | ............ | H01L 27/1259 |
| 2017/0123543 | A1* | 5/2017 | Choi | ............ | G06F 3/0412 |
| 2017/0207249 | A1* | 7/2017 | Rhee | ............ | G09G 3/3233 |

OTHER PUBLICATIONS

Chinese language office action dated Nov. 28, 2019, issued in application No. CN 201711032522.X.

* cited by examiner

| Sample | | Sample 1 | | Sample 2 | | Sample 3 | |
|---|---|---|---|---|---|---|---|
| | | hardness | NG rate | hardness | NG rate | hardness | NG rate |
| supporting film | | HB (over 3B) | 0/5 | HB (over 3B) | 1/5 | B | 1/5 |
| | | B | 0/5 | B | 1/5 | 2B | 0/5 |
| | | 2B | 0/5 | 2B | 0/5 | | |
| | | 3B | 0/5 | | | | |
| | | 4B | 0/5 | | | | |
| flexible substrate | | H | 5/5 | 2B | 1/2 | HB | |
| | | HB | 1/5 | 6B | 1/5 | B | |
| | | B | 0/5 | | | 2B | |
| | | | | | | 6B | |

FIG. 6

DISPLAY DEVICES AND METHODS FOR FORMING THE SAME

CROSS REFERENCE TO RELATED APPLICATIONS

This application claims priority to U.S. Provisional Application No. 62/415,542, filed Nov. 1, 2016, and No. 62/479,326, filed Mar. 31, 2017, the entirety of which is incorporated by reference herein.

BACKGROUND

Field of the Disclosure

The disclosure relates to display devices, and in particular to display devices with a flexible substrate and a supporting film, and methods for forming the same.

Description of the Related Art

A display device with a flexible substrate has the advantages of being able to be bent and rolled, of having a wide view angle, and of being portable. Therefore, a display device with a flexible substrate has a broad scope of applications and favorable market potential in many display application fields, such as portable products.

However, a flexible substrate has to be disposed with a supporting film in a display device, and both of them cannot be too soft. Otherwise, the display device may become damaged during the manufacturing process. Moreover, another important issue is how to monitor the bonding situation in the manufacturing process of the display device with the flexible substrate and the supporting film.

Although existing display devices with flexible substrates and supporting film and methods for forming the same have been adequate for their intended purposes, they have not been entirely satisfactory in all respects. Therefore, there are still some problems that remain to be overcome with regards to the display devices with flexible substrates and supporting film.

BRIEF SUMMARY

Some embodiments of the disclosure provide display devices and methods for forming the same. By choosing a material for the supporting film which is harder and thicker than the material of the flexible substrate, and choosing a material for the flexible substrate which is more heat-resistant than the material of the supporting film, the supporting film can support the light-emitting diodes (LEDs) during the bonding process and the flexible substrate can bear the heat generated during the manufacturing process of the display device. As a result, the display device may remain undamaged.

Moreover, in order to ensure a successful bonding between the light-emitting diodes and the conductive pads on the flexible substrate, which means the light-emitting diodes are electrically connected to the conductive pads, some embodiments of the disclosure further provide the shape of the conductive elements between the light-emitting diodes and the conductive pads.

Specifically, when an anisotropic conductive film containing conductive particles is used as a conductive element, the conductive particles have a height-width ratio in a range from 35% to 65%. When a first electrode of a light-emitting diode is used as a conductive element, in the cross-sectional view after performing the bonding process, at least a portion of the side of the conductive element adjacent to the conductive pad is in a curved shape, and at least a portion of the side of the conductive pad adjacent to the driving layer is also in a curve shaped. The portion of the side of the conductive element and the portion of the side of the conductive pad are conformal curves.

Some embodiments of the disclosure provide a display device. The display device includes a supporting film and a flexible substrate disposed on the supporting film, wherein the supporting film has a first hardness, the flexible substrate has a second hardness, and the first hardness is greater than or equal to the second hardness. The display device also includes a driving layer disposed on the flexible substrate, and a conductive pad disposed on the driving layer. The display device further includes a light-emitting diode disposed on the conductive pad and electrically connected to the conductive pad.

Some embodiments of the disclosure provide a method for forming a display device. The method includes forming a flexible substrate on a carrier substrate, and forming a driving layer on the flexible substrate. The method also includes forming a conductive pad on the driving layer, and performing a bonding process to bond a light-emitting diode to the conductive pad, wherein the light-emitting diode is electrically connected to the conductive pad. The method further includes removing the carrier substrate, and attaching a supporting film to the flexible substrate, wherein the supporting film has a first hardness, the flexible substrate has a second hardness, and the first hardness is greater than or equal to the second hardness.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

FIGS. 1A to 1N are cross sectional views of the display device along line I-I' of FIG. 2.

FIG. 6 is the test results of the pencil hardness of a supporting film and a flexible substrate of a display device in accordance with some embodiments.

DETAILED DESCRIPTION OF THE INVENTION

Figure 1A:
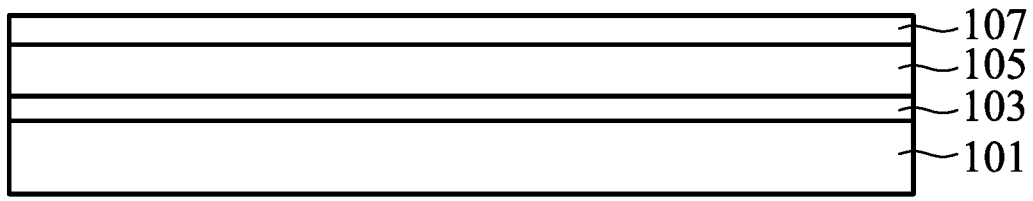
FIGS. 1A to 1N are cross-sectional views illustrating an exemplary sequential formation process of a display device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

Embodiments for forming a display device are provided. FIGS. 1A to 1N are cross-sectional views illustrating an exemplary sequential formation process of a display device 100 of FIG. 1N in accordance with some embodiments of the present disclosure.

As shown in FIG. 1A, a wafer substrate 101 is provided, and a buffer layer 103 is formed on the wafer substrate 101, in accordance with some embodiments. The wafer substrate 101 may be made of silicon, silicon carbide (SiC), gallium nitride (GaN), silicon dioxide (SiO2), sapphire, or a combination thereof. In some embodiments, the buffer layer 103 is formed using metal organic chemical vapor deposition (MOCVD), molecular beam epitaxy (MBE), or a combination thereof. Moreover, the buffer layer 103 may be made of aluminum nitride (AlN), gallium nitride (GaN), aluminum gallium nitride (AlGaN), aluminum gallium indium nitride (InAlGaN), or a combination thereof. In the present embodiment, the buffer layer 103 is made of undoped gallium nitride (GaN).

Still referring to FIG. 1A, a first doped layer 105 is formed on the buffer layer 103, and a second doped layer 107 is formed on the first doped layer 105. Some processes and base materials used to form the first doped layer 105 and the second doped layer 107 are similar to, or the same as, those used to form the buffer layer 103, so the descriptions thereof are not repeated herein. In the present embodiment, the first doped layer 105 is n-type, in which suitable n-type dopants are implanted therein, such as phosphorous (P), arsenic (As) or the like, and the second doped layer 107 is p-type, in which suitable p-type dopants are implanted therein, such as boron (B), gallium (Ga), Indium (In) or the like.

Figure 1B:
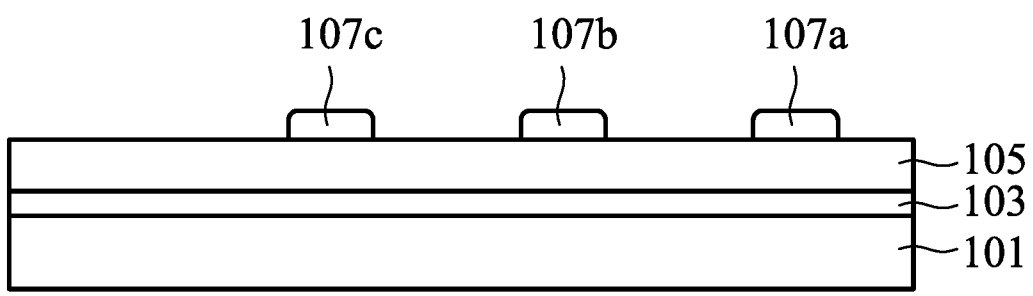

Then, as shown in FIG. 1B, a plurality of second doped patterns 107a, 107b and 107c are formed from the second doped layer 107 on the first doped layer 105. The second doped patterns 107a, 107b and 107c are formed by performing a photolithography process to form a patterned mask on the second doped layer 107 and performing an etching process on the second doped layer 107 using the patterned mask.

Figure 1C:
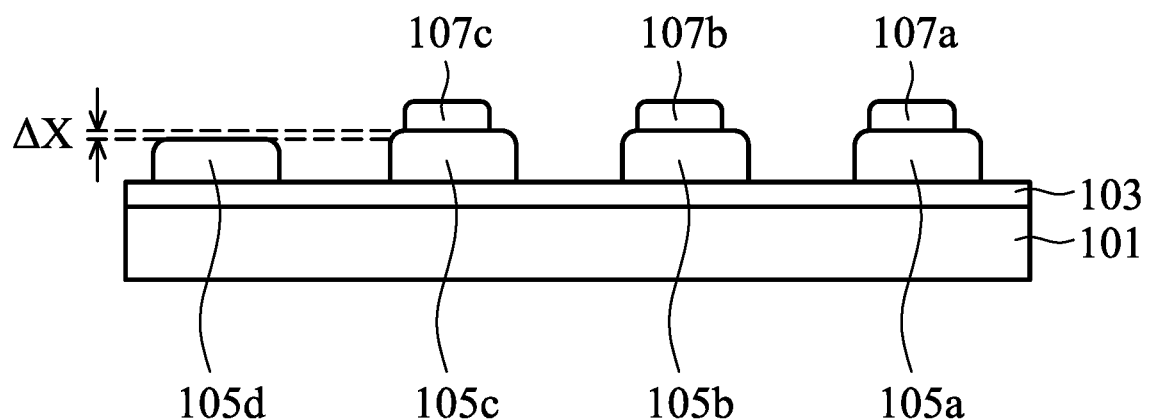

Thereafter, as shown in FIG. 1C, a plurality of first doped patterns 105a, 105b, 105c and 105d are formed from the first doped layer 105 on the buffer layer 103. Some processes used to form the first doped patterns 105a, 105b, 105c and 105d are similar to, or the same as, those used to form the second doped patterns 107a, 107b and 107c, so the descriptions thereof are not repeated herein. In some embodiments, the locations of the first doped patterns 105a, 105b and 105c are corresponding to the locations of the second doped patterns 107a, 107b and 107c respectively. For example, the second doped pattern 107a is disposed on the first doped pattern 105a. Moreover, the heights and the widths of the first doped patterns 105a, 105b, 105c and 105d are greater than those of the second doped patterns 107a, 107b and 107c.

It is important to note that there may be a height difference Δ X between the heights of the first doped patterns 105c and 105d. Since there is no second doped pattern located on the first doped pattern 105d, the first doped pattern 105d without second doped pattern thereon may be over etched during its forming process.

Figure 1D:
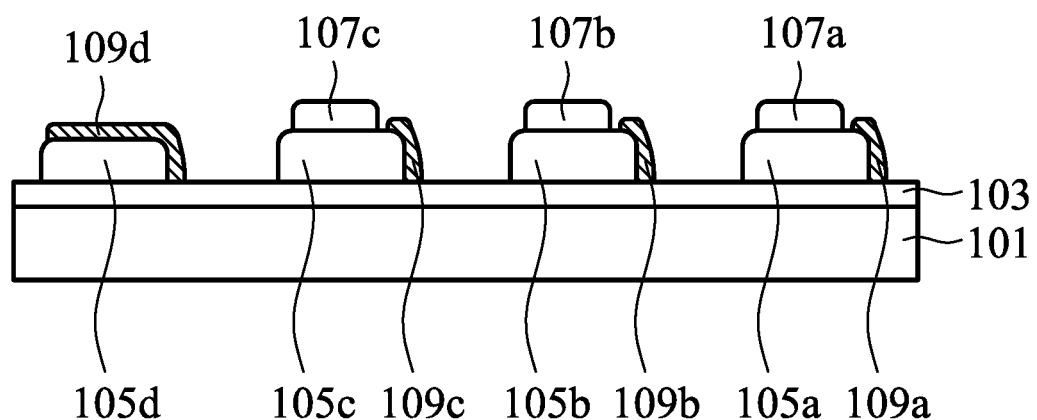

Next, referring to FIG. 1D, a plurality of second electrodes 109a, 109b, 109c and 109d are formed on the first doped patterns 105a, 105b, 105c and 105d, and on the buffer layer 103. In some embodiments, the second electrodes 109a, 109b, 109c and 109d are made of a metal with good electrical conductivity, such as gold (Au), silver (Ag), copper (Cu), platinum (Pt), aluminum (Al), nickel (Ni), tin (Sn), magnesium (Mg), a combination thereof, or another conductive material. Moreover, the second electrodes 109a, 109b, 109c and 109d are formed by a deposition process and a patterning process. The deposition process may be a chemical vapor deposition (CVD) process, a physical vapor deposition (PVD) process, an atomic layer deposition (ALD) process, a high density plasma chemical vapor deposition (HDPCVD) process, a metal organic chemical vapor deposition (MOCVD) process, a plasma enhanced chemical vapor deposition (PECVD) process, or a combination thereof.

More specifically, the second electrodes 109a, 109b and 109c are mainly disposed on portions of the sidewalls of the first doped patterns 105a, 105b and 105c, and further extended to portions of the top surfaces of the first doped patterns 105a, 105b and 105c respectively. In particular, the second electrode 109d is disposed on a portion of the sidewall of the first doped pattern 105d and covers almost the entire top surface of the first doped pattern 105d.

Figure 1E:
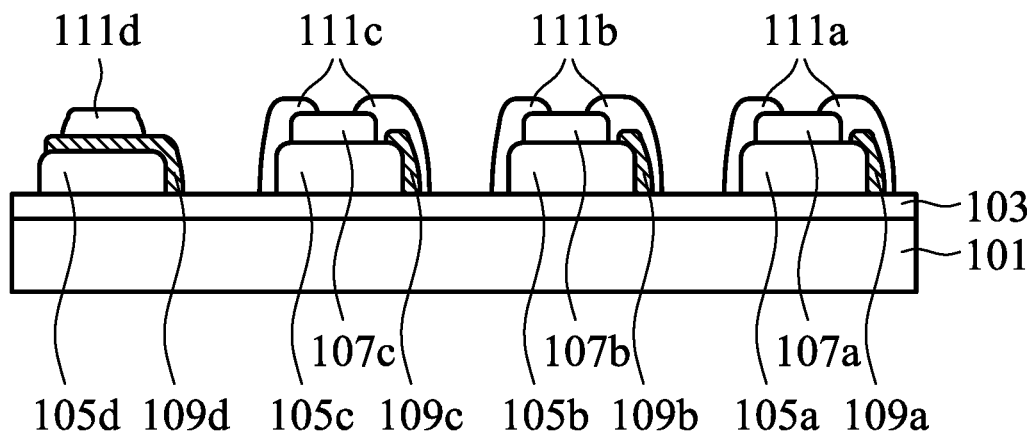

As shown in FIG. 1E, a plurality of insulating layers 111a, 111b and 111c are formed on the sidewalls of the first doped patterns 105a, 105b and 105c, the second doped patterns 107a, 107b and 107c and the second electrodes 109a, 109b and 109c to expose a portion of the second doped patterns 107a, 107b and 107c respectively, in accordance with some embodiments. In addition, an insulating layer 111d is formed on the top surface of the second electrode 109d. In some embodiments, the insulating layers 111a, 111b, 111c and 111d are made of silicon oxide, silicon nitride, silicon oxynitride or another suitable insulating material. The insulating layer 111a, 111b, 111c and 111d may be formed by a deposition process, a stamping process, an injecting process, or another suitable process.

Subsequently, referring to FIG. 1F, a plurality of first electrodes 113a, 113b and 113c are formed on the second doped patterns 107a, 107b, 107c and the insulating layers 111a, 111b, 111c respectively. Moreover, a first electrode 113d is formed on the second electrode 109d and the insulating layer 111d. Some materials and processes used to form the first electrodes 113a, 113b, 113c and 113d are similar to, or the same as, those used to form the second electrodes 109a, 109b, 109c and 109d, so the descriptions thereof are not repeated herein.

Figure 1F:
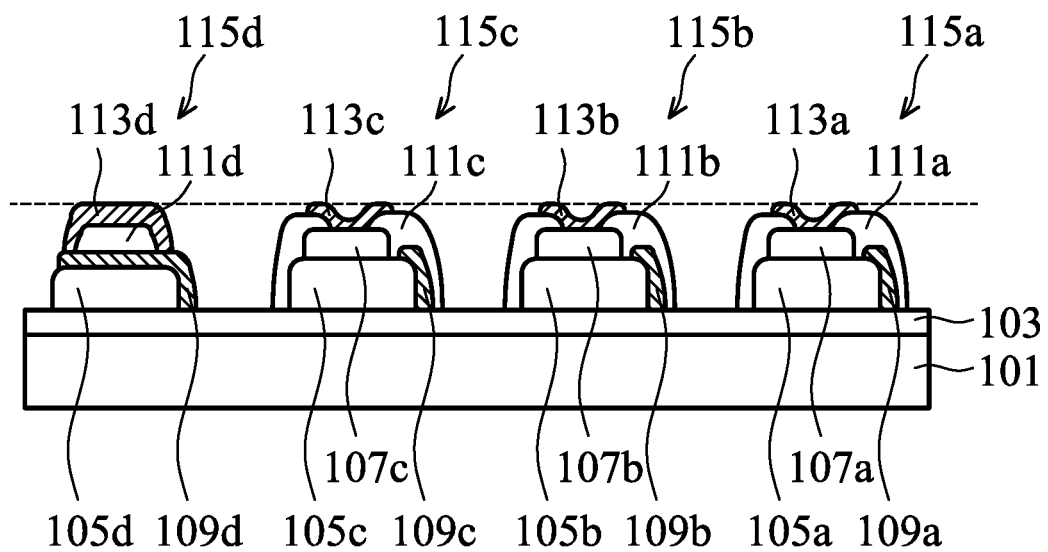

It is important to note that the first electrodes 113a, 113b, 113c and 113d have coplanar topmost surfaces (as shown by the dashed line of FIG. 1F). Once the first electrodes 113a, 113b, 113c and 113d are formed, a plurality of light-emitting diodes 115a, 115b and 115c are completed. In some embodiments, the light-emitting diodes 115a, 115b and 115c may be micro light-emitting diodes (μ-LEDs). Specifically, the micro light-emitting diodes have a length and a width about dozens of microns, and a height about ten microns. In particular, the micro light-emitting diodes may have a height in a range from about 5 microns to about 8 microns.

The light-emitting diode 115a is composed of the first doped pattern 105a, the second doped pattern 107a, the second electrode 109a, the insulating layers 111a and the first electrode 113a. The compositions of the light-emitting diodes 115b and 115c are the same as that of the light-emitting diode 115a, so the descriptions thereof are not repeated herein. In addition, the first doped pattern 105d, the second electrode 109d, the insulating layer 111d and the first electrode 113d composes a conductive structure 115d. The conductive structure 115d is used for electrical connection and signal transduction, and the conductive structure 115d is usually located at but is not limited to the edges of the wafer substrate 101.

Figure 1G:
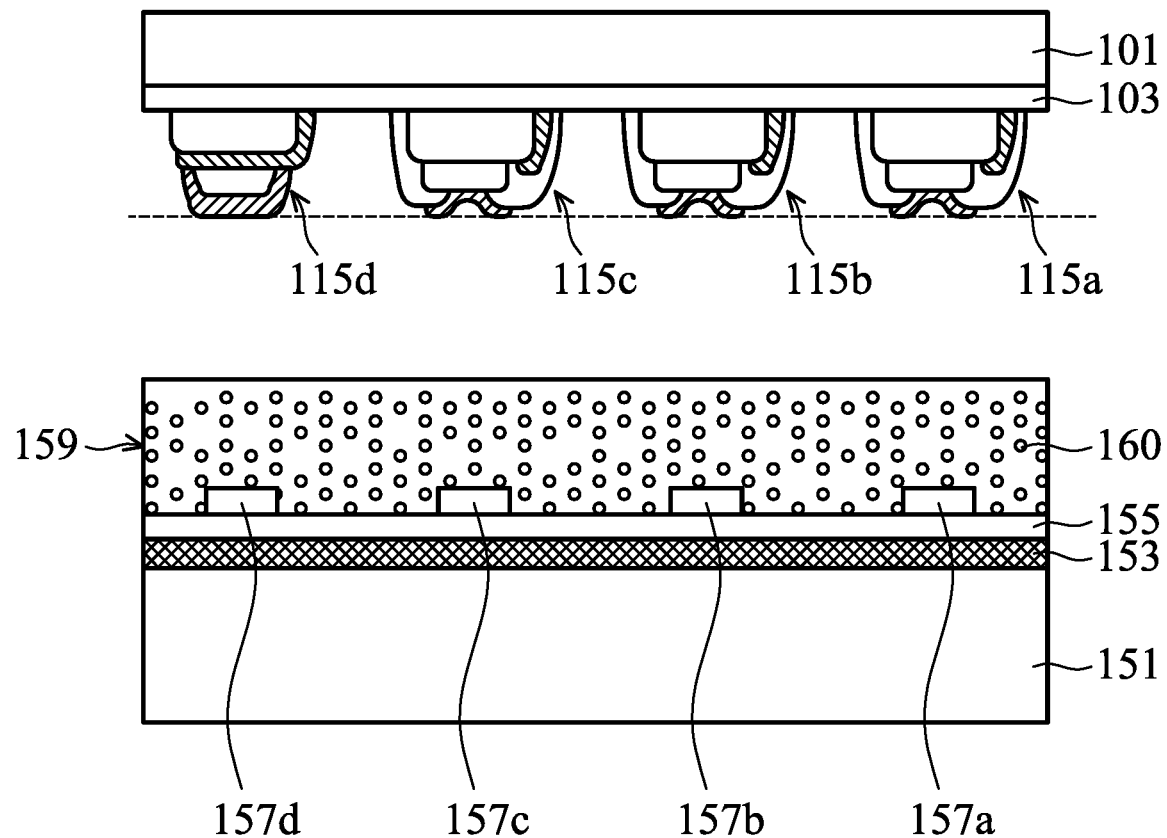

As shown in FIG. 1G, the wafer substrate 101 and the elements formed thereon as shown in FIG. 1F are flipped upside down to face a carrier substrate 151, in accordance with some embodiments. The carrier substrate 151 may be a glass substrate or a plastic substrate. Moreover, a flexible substrate 153 is formed on the carrier substrate 151, a driving layer 155 is formed on the flexible substrate 153, and a plurality of conductive pads 157a, 157b, 157c and 157d are formed on the driving layer 155.

The flexible substrate 153 may be made of a polymer material, such as polyimide (PI) resin, polyetherimide (PEI) resin, polycarbonate (PC) resin, polymethylmethacrylate (PMMA) resin, polystyrene (PS) resin, styrene-acrylonitrile copolymer (SAN) resin, silicone-acrylic resin, a combination thereof, or another suitable polymer material. The driving layer 155 can include a plurality of thin-film transistors (TFT), capacitors, conductive layers, contact windows, insulating layers or other semiconductor devices. Furthermore, the conductive pads 157a, 157b, 157c and 157d are made of metal with good electric conductivity, such as gold (Au), silver (Ag), copper (Cu), platinum (Pt), aluminum (Al), nickel (Ni), tin (Sn), magnesium (Mg), a combination thereof, or another conductive material. The flexible substrate 153, the driving layer 155, and the conductive pads 157a, 157b, 157c and 157d are formed by a deposition process, a stamping process, or another suitable process.

Next, still referring to FIG. 1G, an anisotropic conductive film (ACF) 159 containing a plurality of conductive particles 160 is formed on the driving layer 155 and the conductive pads 157a, 157b, 157c and 157d. More specifically, the conductive particles 160 are evenly dispersed in the anisotropic conductive film 159. The anisotropic conductive film 159 may be made of a resin material, and the conductive particles 160 are gel-type materials encapsulated by metal materials.

Figure 1H:
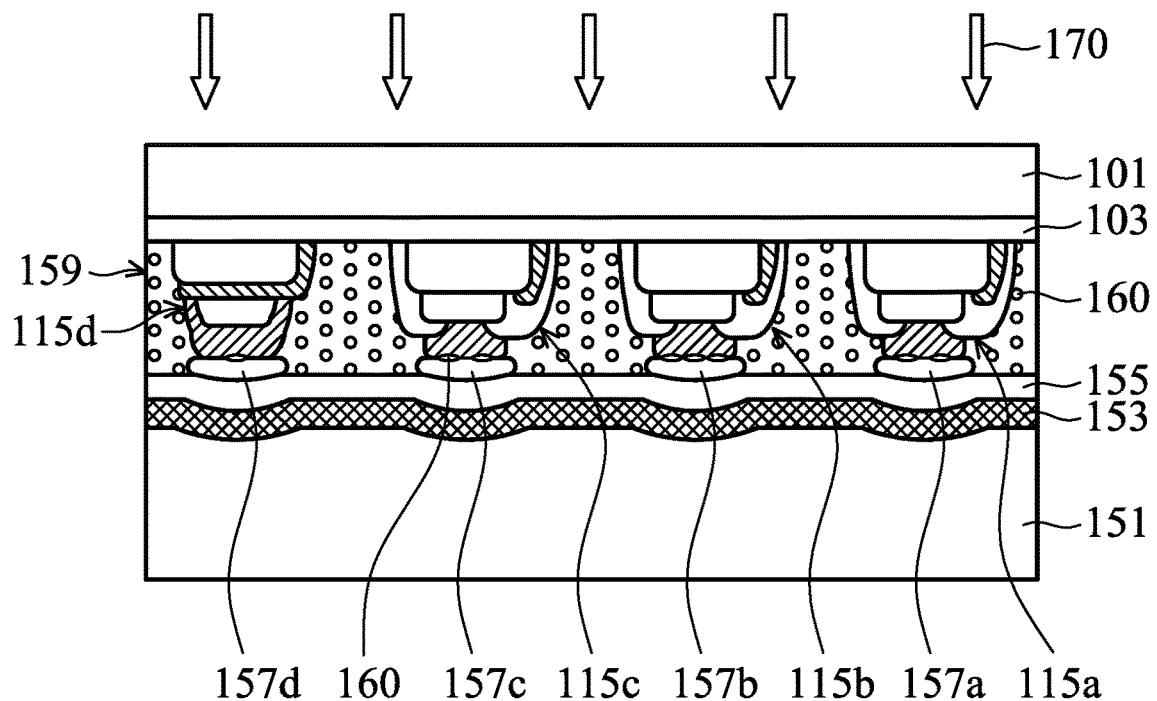

As shown in FIG. 1H, a bonding process 170 is performed to make the wafer substrate 101 bond to the carrier substrate 151, in accordance with some embodiments. In some embodiments, the quantity of the conductive particles 160 in the anisotropic conductive film 159 being clamped and squeezed between each of the light-emitting diodes 115a, 115b, 115c, the conductive structure 115d and each of the corresponding conductive pads 157a, 157b, 157c and 157d is in a range from about 1 to about 3, but it can be more than 3 in other embodiments.

Still referring to FIG. 1H, the conductive pads 157a, 157b, 157c and 157d, the driving layer 155, the flexible substrate 153 and the carrier substrate 151 may be pressed downward during the bonding process 170. Specifically, the conductive pads 157a, 157b, 157c and 157d, the driving layer 155, the flexible substrate 153 and the carrier substrate 151 may have a curved recess shape corresponding to the locations of the first electrode 113a, 113b, 113c and 113d (as shown in FIG. 1F) and the locations of the conductive particles 160 between the light-emitting diodes 115a, 115b, 115c, the conductive structure 115d and the conductive pads 157a, 157b, 157c, 157d.

It is important to note that, in the cross-sectional view of FIG. 1H, the interface between the conductive particles 160 and the conductive pads 157a, 157b, 157c, 157d, the interface between the conductive pads 157a, 157b, 157c, 157d and the driving layer 155, the interface between the driving layer 155 and the flexible substrate 153, and the interface between the flexible substrate 153 and the carrier substrate 151 are curved shapes.

Figure 1I:
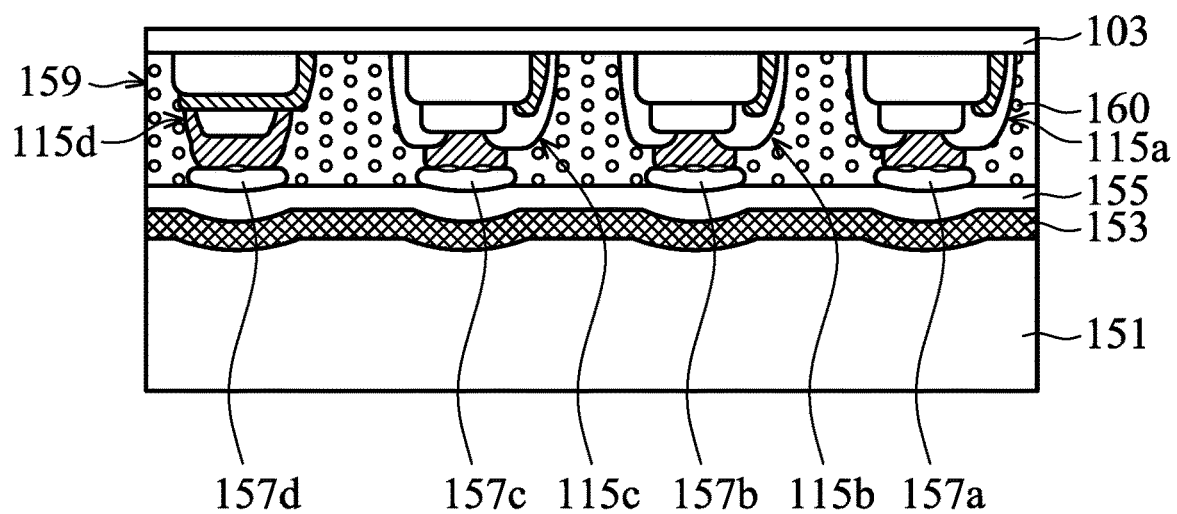
Figure 1J:
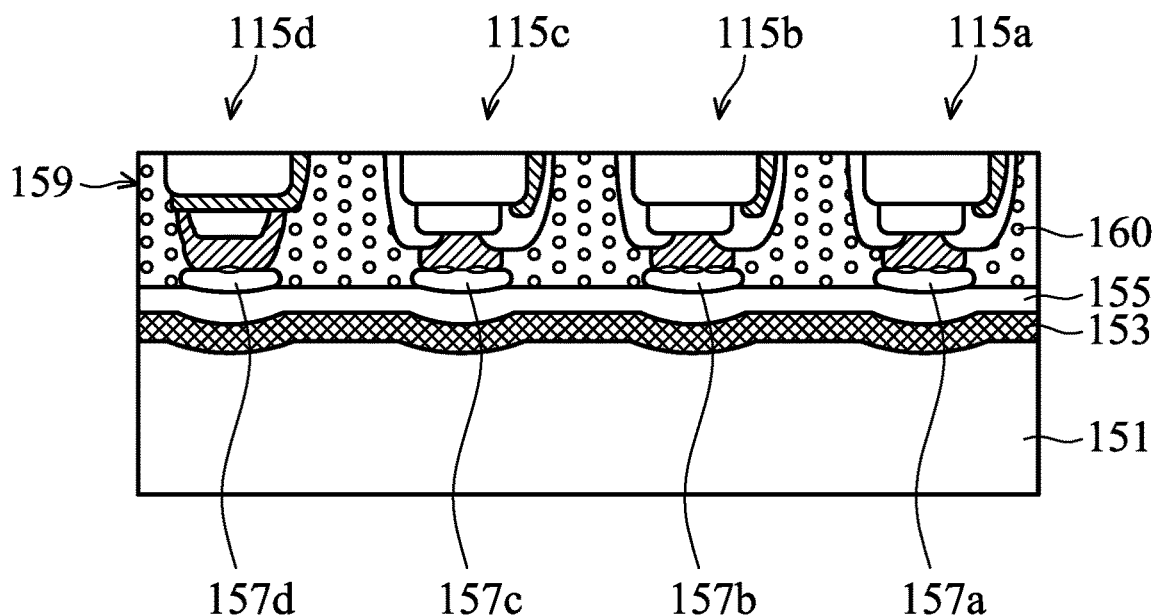

Next, referring to FIG. 1I, the wafer substrate 101 is removed. In some embodiments, the wafer substrate 101 may be removed using a laser lift off process. Then, the buffer layer 103 is removed by an etching process, as shown in FIG. 1J, and the light-emitting diodes 115a, 115b, 115c and the conductive structure 115d are exposed.

Figure 1K:
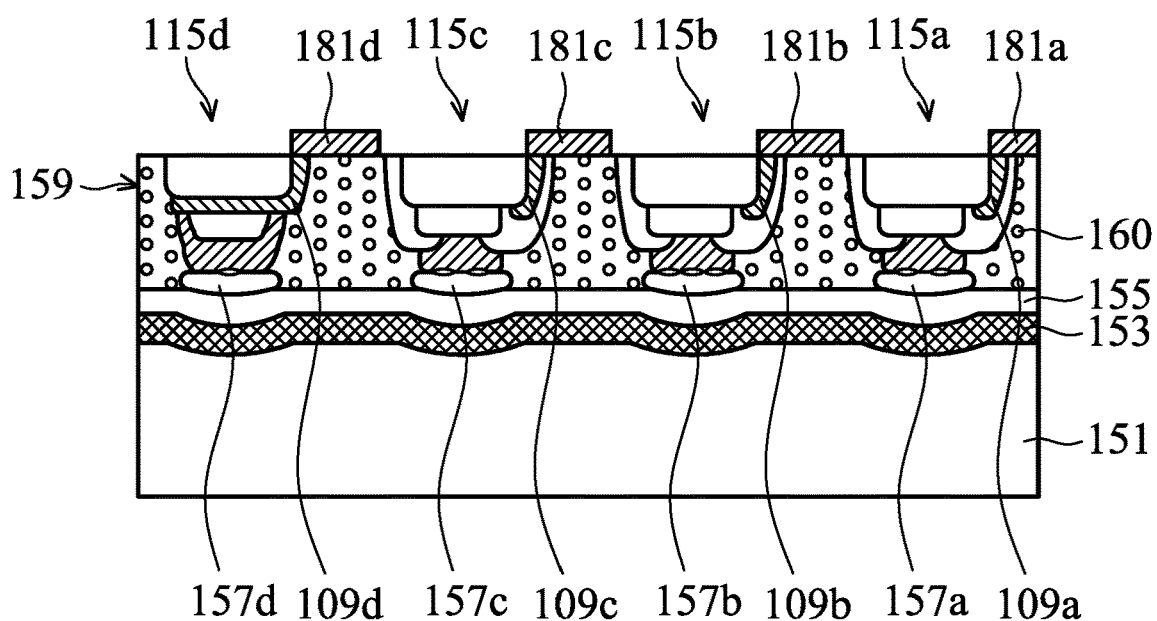

As shown in FIG. 1K, a plurality of extension portions 181a, 181b, 181c and 181d are formed on the anisotropic conductive film 159, the light-emitting diodes 115a, 115b, 115c, and the conductive structure 115d. Specifically, the top surface of the anisotropic conductive film 159 between the light-emitting diodes 115a, 115b, 115c and the conductive structure 115d are covered by the extension portions 181a, 181b, 181c and 181d. In some embodiments, the extension portions 181a, 181b, 181c and 181d are electrically connected to the second electrodes 109a, 109b, 109c and 109d respectively. Some materials and processes used to form the extension portions 181a, 181b, 181c and 181d are similar to, or the same as, those used to form the second electrodes 109a, 109b, 109c and 109d, and descriptions thereof are not repeated herein.

Figure 1L:
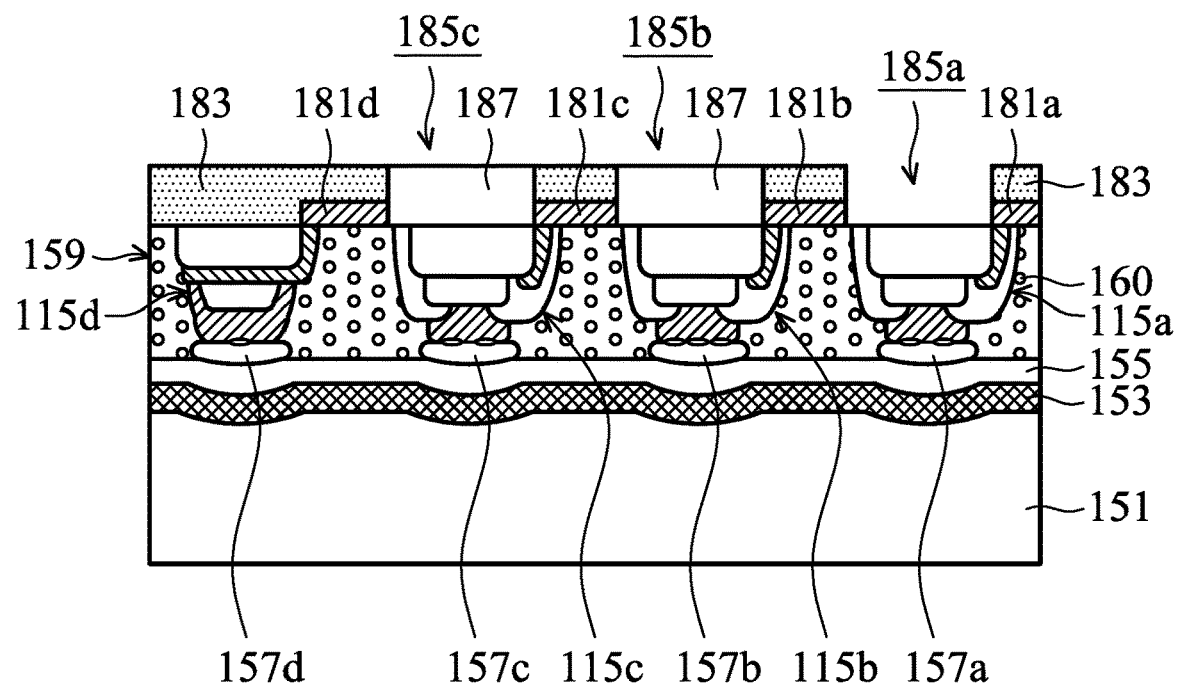

Then, referring to FIG. 1L, a light-shielding layer 183 (e.g. a black matrix (BM) layer) may be formed on the extension portions 181a, 181b, 181c, 181d and the conductive structure 115d, and portions of the light-emitting diodes 115a, 115b, 115c are exposed by a plurality of openings 185a, 185b and 185c respectively, after forming the light-shielding layer 183. In some embodiments, the light-shielding layer 183 can include, but is not limited to, black photoresist, black printing ink, black resin or any other suitable light-shielding materials of various colors. The light-shielding layer 183 is used to isolate the light emitted by the light-emitting diodes 115a, 115b and 115c.

After forming the light-shielding layer 183, an optical transfer layer 187 may optionally be formed in the openings 185a, 185b and 185c. In the present embodiment of FIG. 1L, the optical transfer layer 187 is disposed in the openings 185b and 185c, and it is not disposed in the opening 185a. The optical transfer layer 187 may be made of, but is not limited to, a phosphor layer, a fluorescent powder layer, a quantum-dot layer, an epoxy resin layer, a silicone resin layer combined with a quantum-dot material or a combination thereof in an injecting process or a coating process, and the portions of the optical transfer layer 187 corresponded to the light-emitting diodes 115b and 115c may be made of the same material or different materials. For example, the portions of the optical transfer layer 187 corresponded to the light-emitting diodes 115b and 115c are usually made of the same resin layer combined with the same quantum-dot material having different diameters. Examples of the quantum-dot materials may be, but are not limited to, ZnS, ZnSe, ZnTe, CdSe, CdTe, CdS, GaN, InN, InP, InAs, PbS, PbSe. Moreover, the optical transfer layer 187 can transfer the wavelength of the light emitted from the light-emitting diodes 115b and 115c, so that the color of the light emitted from the light-emitting diodes 115b and 115c may be changed. It should be noted that the forming processes and the locations of the light-shielding layer 183 and the optical transfer layer 187 are not limited to the foregoing description.

Figure 1M:
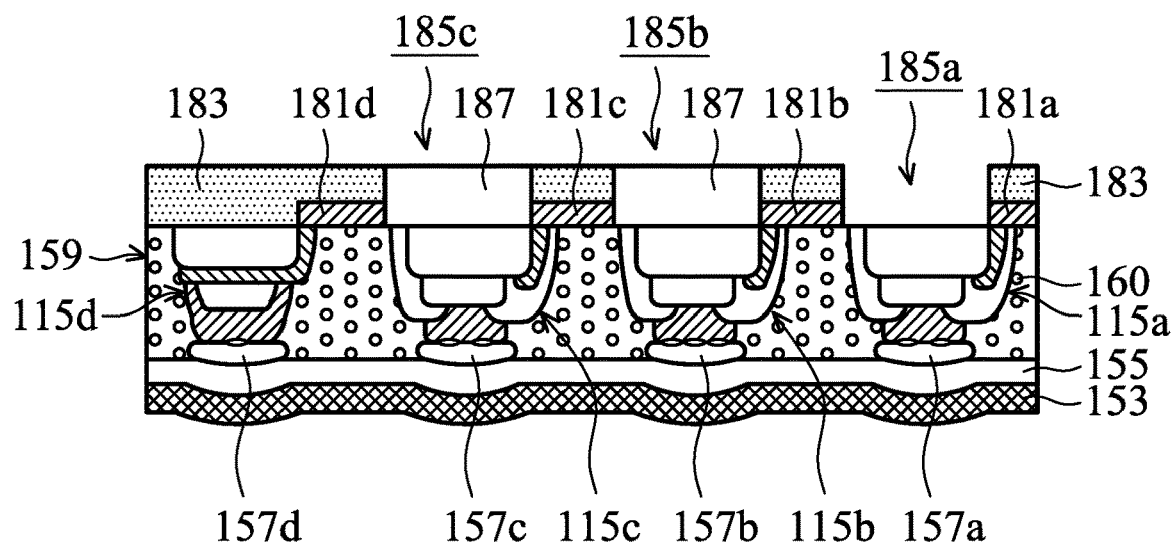
Figure 1N:
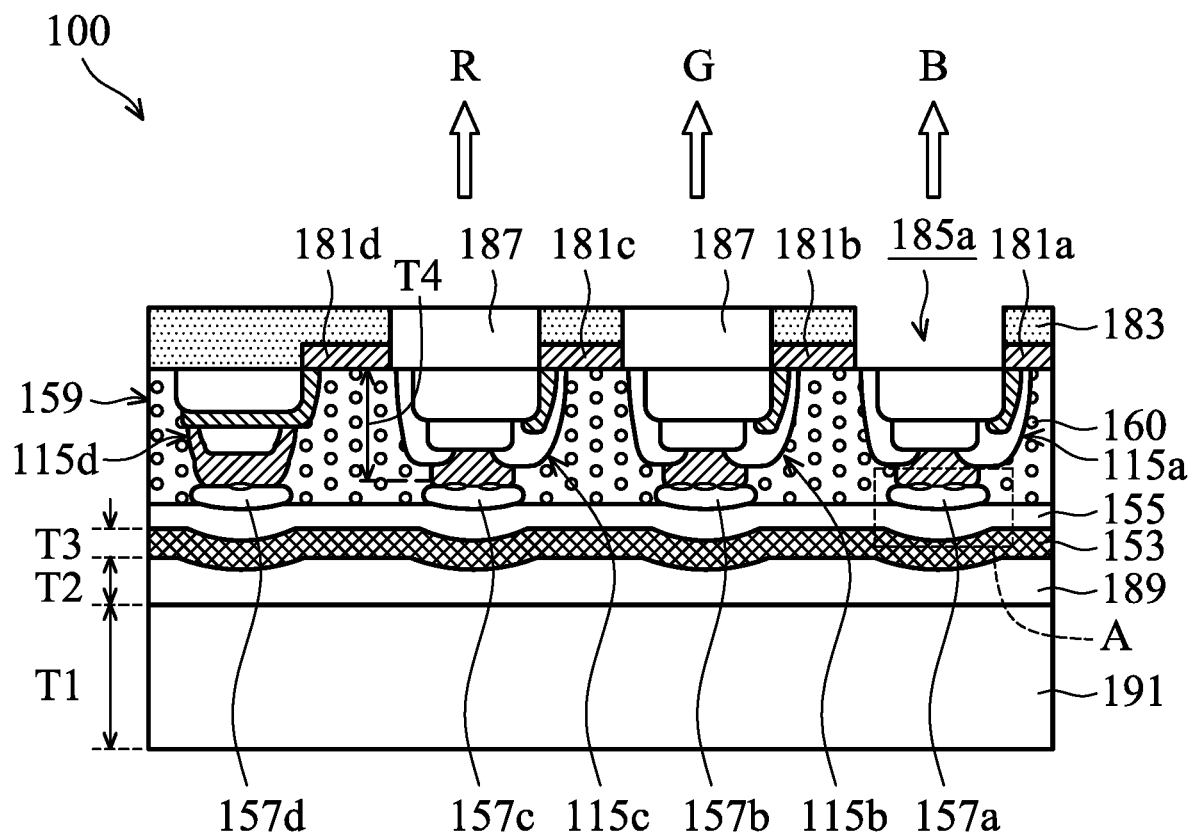

Next, as shown in FIG. 1M, the carrier substrate 151 is removed. In some embodiments, the carrier substrate 151 may be removed using a laser lift off process. Then, a supporting film 191 is attached to the flexible substrate 153 by a layer of supporting glue 189, as shown in FIG. 1N. Once the supporting film 191 is attached to the flexible substrate 153, the display device 100 is completed. In the present embodiment, the light emitted by the light-emitting diodes 115a, 115b and 115c is blue light. The blue light emitted by the light-emitting diode 115b can be transferred to green light by the optical transfer layer 187 thereon, and the blue light emitted by the light-emitting diode 115c can be transferred to red light by the optical transfer layer 187 thereon.

In some embodiments, the supporting film 191 may be made of an insulating material. In particular, the supporting film 191 may be made of a polymer material which is different from the polymer material of the flexible substrate 153, such as polyethylene, naphthalate (PEN), polyethylene terephthalate (PET), polyvinyl chloride (PVC), polypropylene (PP), polyester, polyamide (PA), rubber (natural or synthetic), a combination thereof, or another suitable polymer material.

As shown in FIG. 1N, the supporting film 191 has a thickness T1, the supporting glue 189 has a thickness T2, the flexible substrate 153 has a thickness T3, and the light-emitting diodes 115a, 115b, and 115c have a thickness T4. The thickness T4 is defined as the distance between the topmost and bottommost surfaces of the light-emitting diodes 115a, 115b, and 115c. It should be noted that the thickness T1 is greater than the thicknesses T2, T3 and T4 respectively.

In some embodiments, the hardness of the supporting film 191 is between the 3B and 3H levels of pencil hardness. In particular, the hardness of the supporting film 191 is between the B level and the H level of pencil hardness.

Both of the hardness and the thickness of the supporting film 191 should be greater than that of the flexible substrate 153, and the material of the flexible substrate 153 should be more heat-resistant than the material of the supporting film 191. Thus, the supporting film 191 can support the light-emitting diodes 115a, 115b, 115c and the conductive structure 115d during the bonding process and the flexible substrate 153 can bear the heat generated by the processes in manufacturing the display device 100, so that the display device 100 is not damaged during the fabrication processes according to the embodiments.

Figure 2:
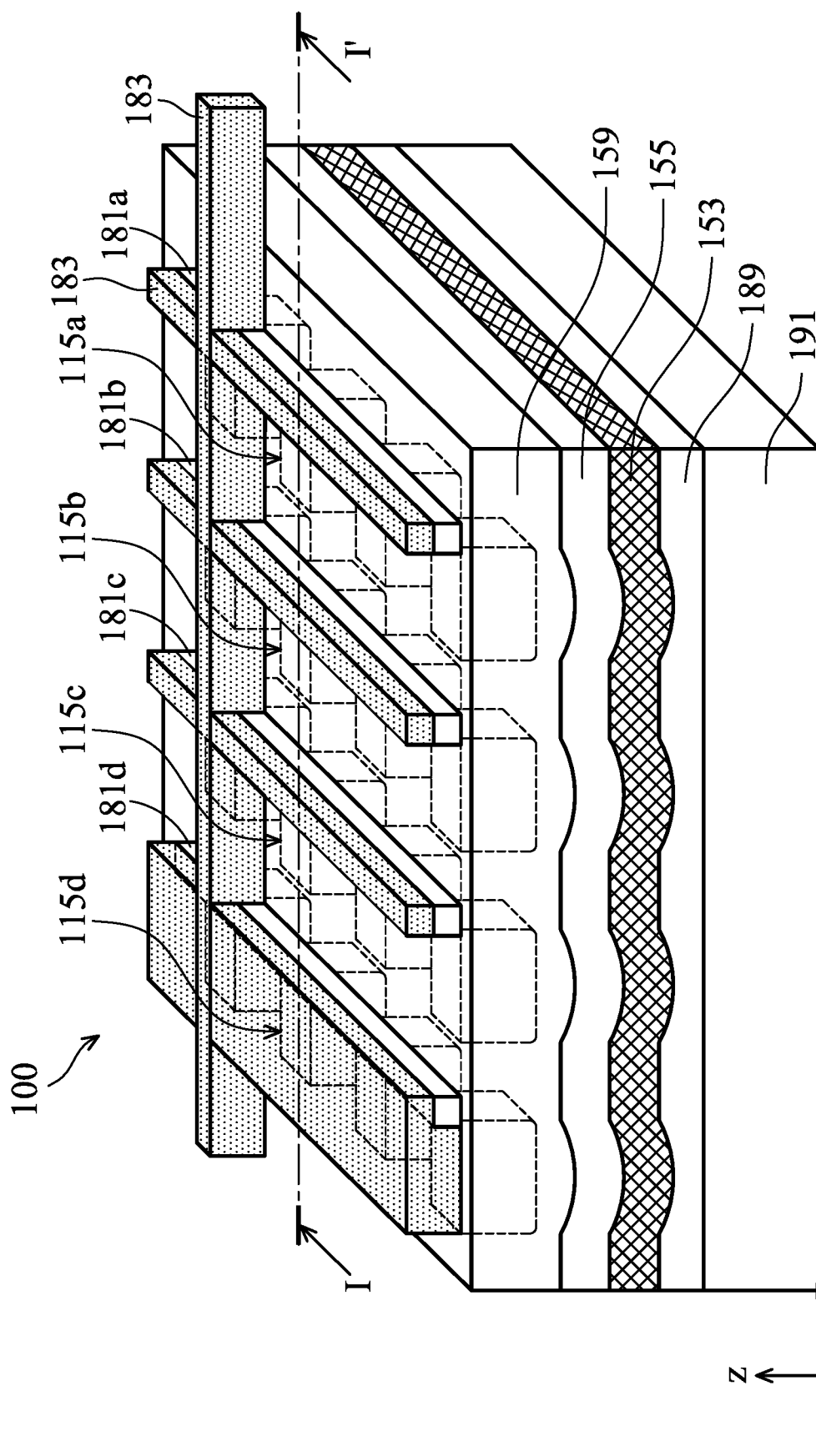
FIG. 2 is a perspective view of a display device in accordance with some embodiments.

FIG. 2 is a perspective view of the display device 100 in accordance with some embodiments. FIGS. 1A to 1N are cross sectional views of the display device 100 along line I-I' of FIG. 2. As shown in FIG. 2, the quantity of the light-emitting diodes (including the light-emitting diodes 115a, 115b and 115c) disposed in the anisotropic conductive film 159 is not limited to three, and the light-shielding layer 183 is disposed to isolate the light-emitting diodes. Therefore, the interference between the light emitted by adjacent light-emitting diodes can be prevented. It should be noted that there is only a single strip of light-shielding layer 183 extended along the x-direction. However, the number of the strips of the light-shielding layer 183 may be more than one.

Figure 3:
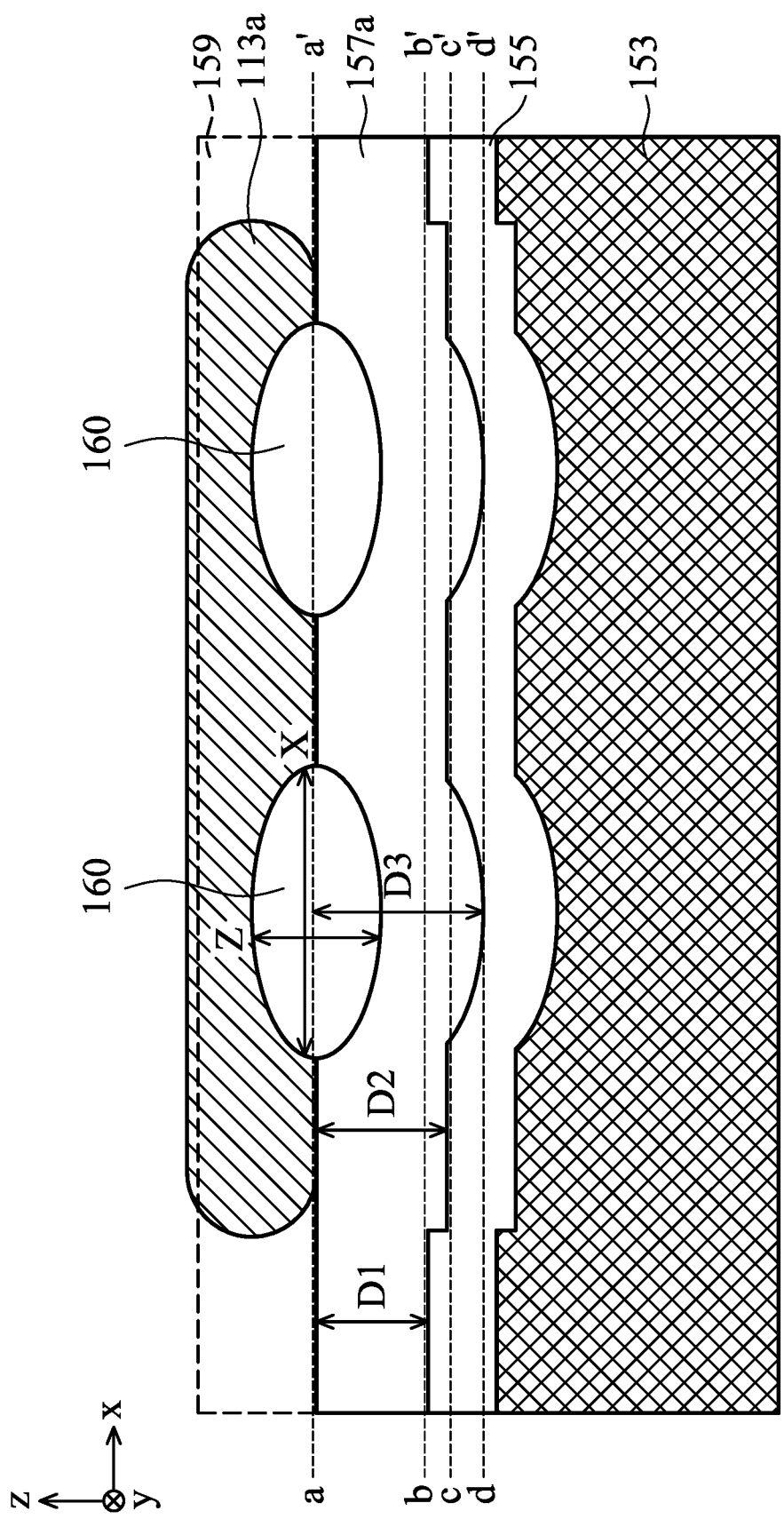
FIG. 3 is a partial enlarged view of region A in FIG. 1N.

FIG. 3 is a partial enlarged view of region A in FIG. 1N. As shown in FIG. 3, the conductive particles 160 clamped and squeezed between the first electrode 113a and the conductive pad 157a have a width X in the x-direction, a width Y (not shown) in the y-direction, and a height Z in the z-direction. In some embodiments, the ratio of the height Z to the width X or the ratio of the height Z to the width Y is in a range from about 35% to about 65%. If the ratio of the height Z to the width X or the ratio of the height Z to the width Y is less than 35%, the structures of the conductive particles 160 may be destroyed. On the other hand, if the ratio of the height Z to the width X or the ratio of the height Z to the width Y is more than 65%, the conductive particles 160 may be slightly touched by the light-emitting diodes 115a, 115b, 115c, the conductive structure 115d and the conductive pads 157a, 157b, 157c, 157d. Thus, the conductive path between the light-emitting diodes 115a, 115b, 115c, the conductive structure 115d and the conductive pads 157a, 157b, 157c, 157d may not be formed successfully.

Moreover, the interface between the conductive particles 160 and the conductive pad 157a, a portion of the interface between the conductive pad 157a and the driving layer 155, and a portion of the interface of the driving layer 155 and the flexible substrate 153 are curved, and the aforementioned curved portions are conformal. In some embodiments, the curved portions can be observed using an optical microscope (OM), and the curved portions may be circular, elliptical or irregular when viewed from a top view using the optical microscope.

Still referring to FIG. 3, a horizontal line a-a' is aligned with the topmost surface of the conductive pad 157a, a horizontal line b-b' is aligned with the portion of the top surface of the driving layer 155 which is not located under the first electrode 113a, a horizontal line c-c' is aligned with the portion of the top surface of the driving layer 155 which is located under the first electrode 113a but not under the conductive particles 160, and a horizontal line d-d' is aligned with the lowest portion of the curved top surface of the driving layer 155 which is located under the conductive particles 160.

There is a distance D1 between the horizontal lines a-a' and b-b', a distance D2 between the horizontal lines a-a' and c-c', and a distance D3 between horizontal lines a-a' and d-d'. The distance D1 is the thickness of the conductive pad 157a which is not influenced by the bonding process, that is, the thickness that is not being pressed downward. The distance D2 reflects the influence of the conductive pad 157a being pressed downward by the first electrode 113a. The distance D3 reflects the influence of the conductive pad 157a being pressed downward by the first electrode 113a and the conductive particles 160. It should be noted that the distances D1, D2 and D3 are different. In the present embodiment, distance D3 is greater than distance D2, and distance D2 is greater than distance D1.

Figure 4A:
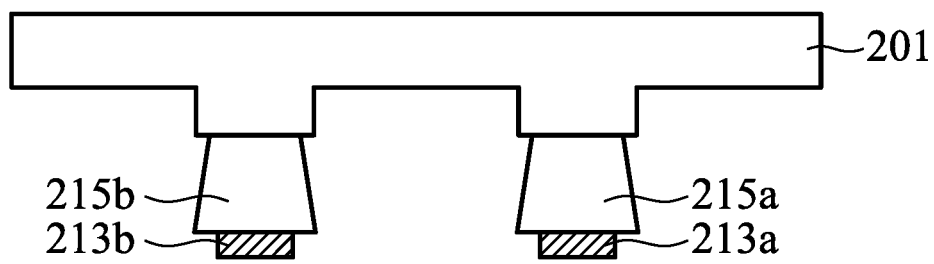
FIGS. 4A to 4G are cross-sectional views illustrating an exemplary sequential formation process of a display device in accordance with some other embodiments.
Figure 4A:
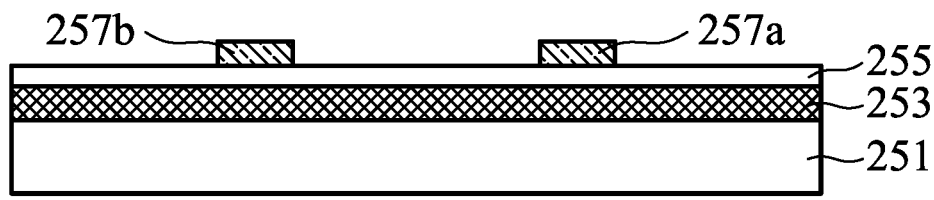
Figure 4B:
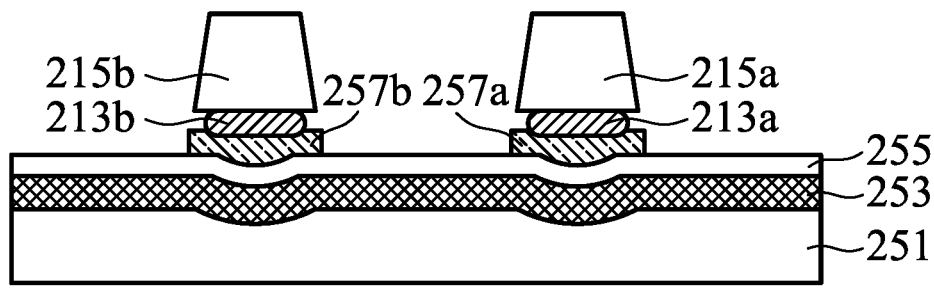
Figure 4C:
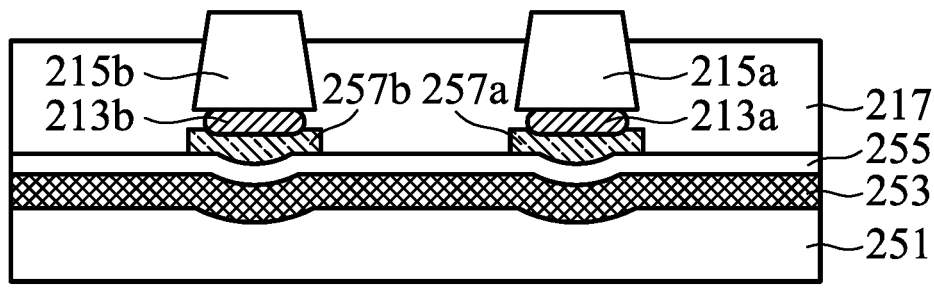
Figure 4D:
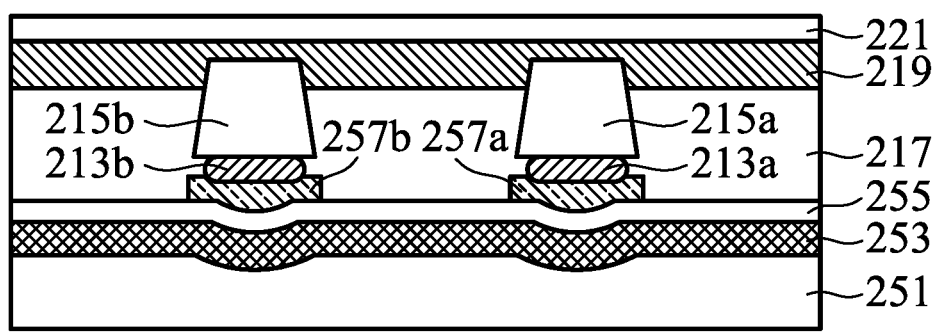
Figure 4E:
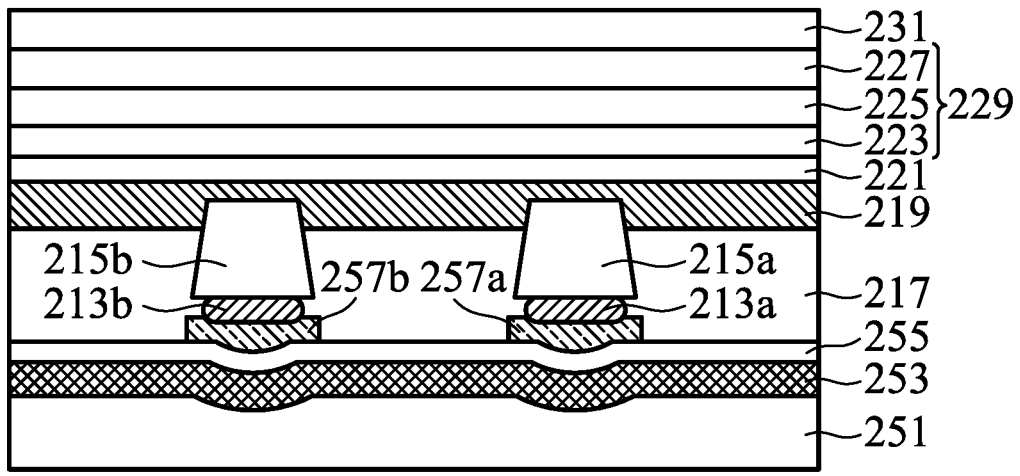
Figure 4F:
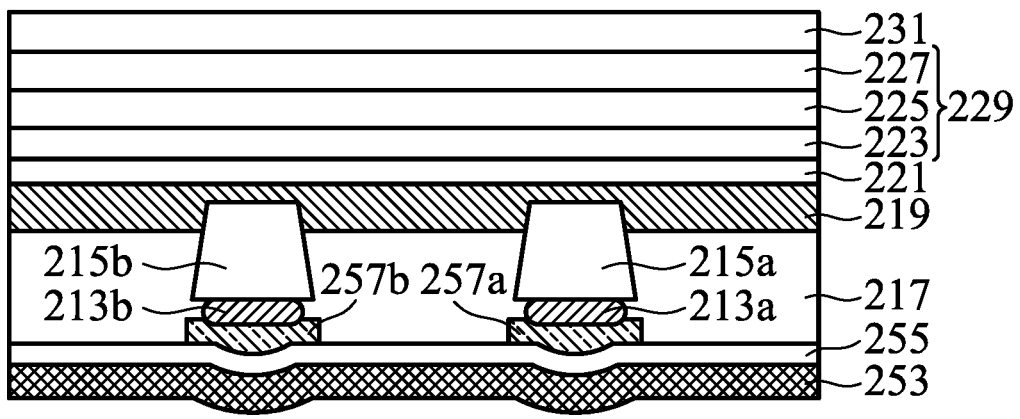
Figure 4G:
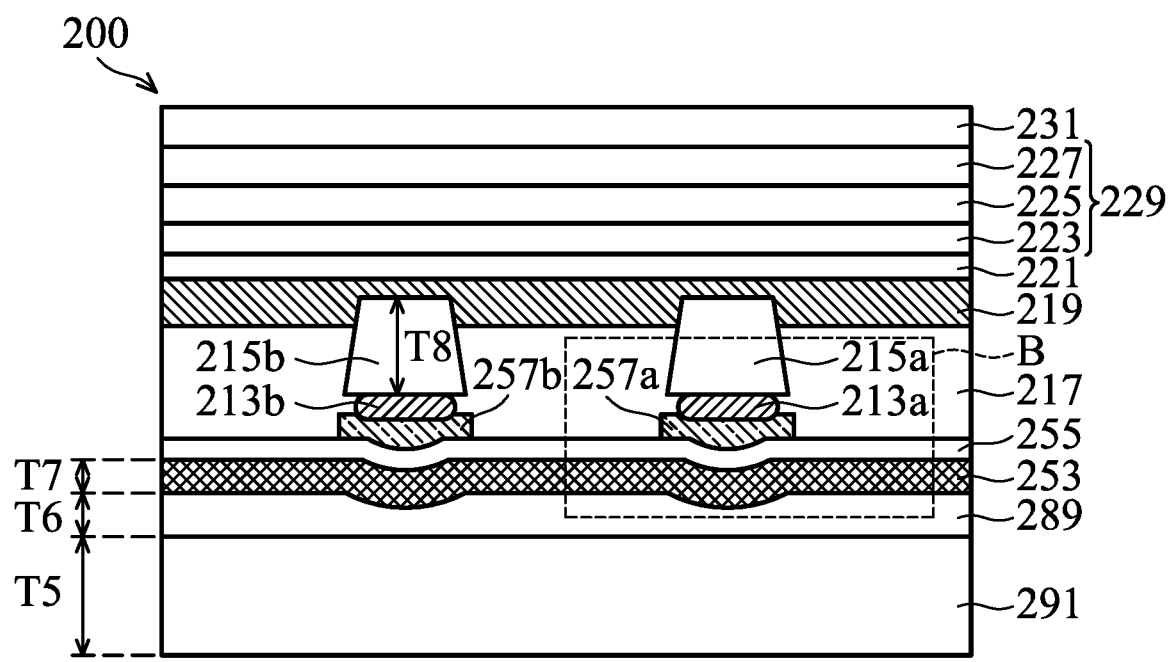

FIGS. 4A to 4G are cross-sectional views illustrating an exemplary sequential formation process of a display device 200 of FIG. 4G in accordance with other embodiments.

As shown in FIG. 4A, light-emitting diodes 215a and 215b are adsorbed or adhered by a transfer head array 201, and conductive elements 213a and 213b (also called first electrodes) are formed on the other side of the light-emitting diodes 215a and 215b respectively. In some embodiments, the light-emitting diodes 215a and 215b may be micro light-emitting diodes.

Moreover, a carrier substrate 251 is provided, a flexible substrate 253 is formed on the carrier substrate 251, a driving layer 255 is formed on the flexible substrate 253, and conductive pads 257a, 257b are formed on the driving layer 255. Some processes and materials used to form the light-emitting diodes 215a and 215b, the conductive elements 213a and 213b, the carrier substrate 251, the flexible substrate 253, the driving layer 255 and the conductive pads 257a, 257b are similar to, or the same as, those used to form the corresponding elements shown in FIG. 1N, and the descriptions thereof are not repeated herein.

In the present embodiment, the conductive elements 213a, 213b and the conductive pads 257a, 257b may be made of In—Pd, Au—Sn, Pb—Sn, In—Sn, Au—Si, Au—Au, a combination thereof, or another suitable metal/alloy for eutectic bonding.

As shown in FIG. 4B, a bonding process is performed by using the transfer head array 201 to make the light-emitting diodes 215a and 215b bond to the flexible substrate 253 via eutectic bonding between the conductive elements 213a, 213b and the conductive pads 257a, 257b. Then, the transfer head array 201 is removed. The conductive pads 257a and 257b, the driving layer 255, the flexible substrate 253 and the carrier substrate 251 may be pressed downward during the bonding process.

Specifically, the conductive pads 257a and 257b, the driving layer 255, the flexible substrate 253 and the carrier substrate 251 may have a curved shape corresponding to the shapes and locations of the conductive elements 213a and 213b.

It should be noted that the interface between the conductive elements 213a, 213b and the conductive pads 257a, 257b, the interface between the conductive pads 257a, 257b and the driving layer 255, the interface between the driving layer 255 and the flexible substrate 253, and the interface between the flexible substrate 253 and the carrier substrate 251 are curved.

Next, referring to FIG. 4C, an insulating layer 217 is formed on the driving layer 255, and a portion of the insulating layer 217 is filled in the space between the light-emitting diodes 215a and 215b, in accordance with some embodiments. The upper portions of the light-emitting diodes 215a and 215b are exposed by the insulating layer 217. Some processes and materials used to form the insulating layer 217 are similar to, or the same as, those used to form the insulating layers 111a, 111b, 111c and 111d of FIG. 1E, so the descriptions thereof are not repeated herein.

Subsequently, a second electrode layer 219 is formed on the insulating layer 217 and covering the exposed portions of the light-emitting diodes 215a and 215b, as shown in FIG. 4D. Then, a passivation layer 221 is formed on the second electrode layer 219. Some processes and materials used to form the second electrode layer 219 and the passivation layer 221 are respectively similar to, or the same as, those used to form the conductive elements 213a, 213b and the insulating layer 217, so the descriptions thereof are not repeated herein.

As shown in FIG. 4E, an optical transfer structure 229 is formed on the passivation layer 221, and a cover layer 231 is formed on the optical transfer structure 229, in accordance with some embodiments. Optionally, an optical transfer structure 229 is formed, and it includes an optical transfer layer 223, an adhesion layer 225 formed on the optical transfer layer 223, and a color filter layer 227 formed on the adhesion layer 225. Some processes and materials used to form the optical transfer layer 223 are similar to, or the same as, those used to form the optical transfer layer 187 of FIG. 1L, so the descriptions thereof are not repeated herein.

Next, referring to FIG. 4F, the carrier substrate 251 is removed. In some embodiments, the carrier substrate 251 may be removed using a laser lift off process. Then, a supporting film 291 is attached to the flexible substrate 253 by a layer of supporting glue 289, as shown in FIG. 4G. Once the supporting film 291 is attached to the flexible substrate 253, the display device 200 is completed. Some processes and materials used to form the supporting film 291 are similar to, or the same as, those used to form the supporting film 191 of FIG. 1N, so the descriptions thereof are not repeated herein.

Still referring to FIG. 4G, the supporting film 291 has a thickness T5, the supporting glue 289 has a thickness T6, the flexible substrate 253 has a thickness T7, and the light-emitting diodes 215a and 215b have a thickness T8. It is important to note that the thickness T5 is greater than each of thicknesses T6, T7 and T8.

In some embodiments, the hardness of the supporting film 291 is between the 3B and 3H levels of pencil hardness. In particular, the hardness of the supporting film 291 is between the B level and the H level of pencil hardness.

Both of the hardness and the thickness of the supporting film 293 should be greater than that of the flexible substrate 253, and the material of the flexible substrate 253 should be more heat-resistant than the material of the supporting film 291. Thus, the supporting film 291 can support the light-emitting diodes 215a and 215b during the bonding process and the flexible substrate 253 can bear the heat generated by the process in manufacturing the display device 200, so that the display device 200 is not damaged during the fabrication processes.

Figure 4H:
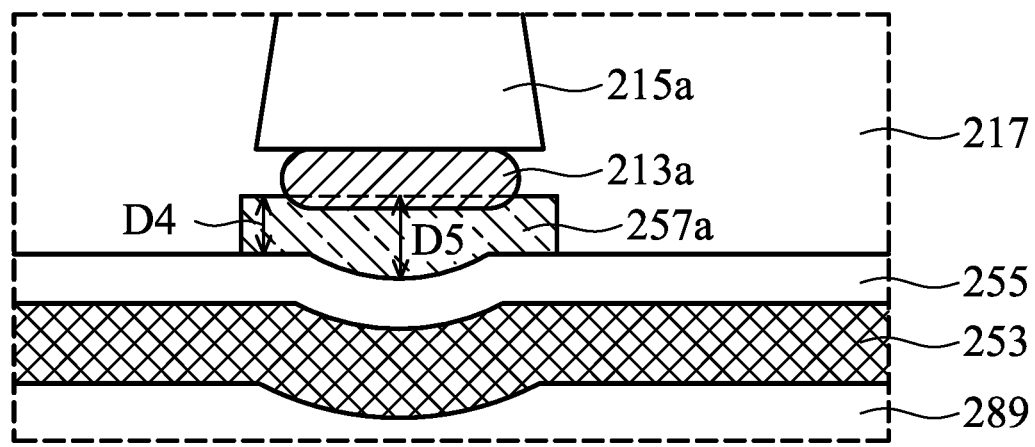
FIG. 4H is a partial enlarged view of region B in FIG. 4G.

FIG. 4H is a partial enlarged view of region B in FIG. 4G. As shown in FIG. 4H, the interface between the conductive element 213a and the conductive pad 257a, a portion of the interface between the conductive pad 257a and the driving layer 255, a portion of the interface of the driving layer 255 and the flexible substrate 253, and a portion of the interface between the flexible substrate 253 and the supporting glue 289 are curved, and the aforementioned curved portions are conformal. In some embodiments, the curved portions can be observed using an optical microscope (OM), and the curved portions may be circular, elliptical or irregular in a top view observed by the optical microscope.

Still referring to FIG. 4H, an extension line of the top surface of the conductive pad 257a not covered by the conductive element 213a is shown as a dashed line. Distance D4 is equal to the thickness of the portion of the conductive pad 257a which is not covered by the conductive element 213a, and distance D5 is defined as the distance between the extension line and the bottommost surface of the conductive pad 257a.

Distance D4 is the thickness of the conductive pad 257a which is not influenced by the bonding process, that is, the thickness that is not being pressed downward. Distance D5 reflects the influence of the conductive pad 257a being pressed downward by the conductive element 213a. It should be noted that distances D4 and D5 are different. In the present embodiment, distance D5 is greater than distance D4. In some embodiments, distance D4 is less than the thickness of the conductive element 213a.

Figure 5A:
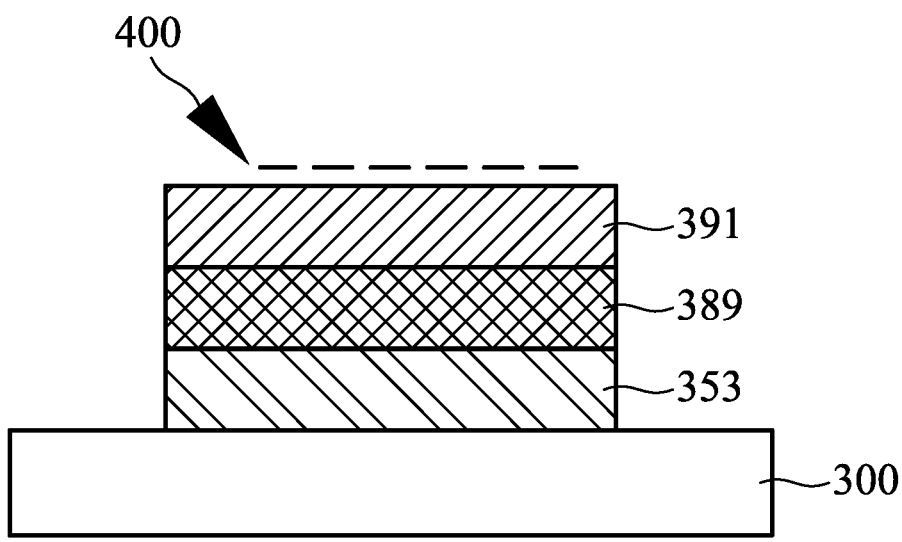
FIG. 5A is a cross-sectional view illustrating an exemplary testing method of a supporting film of a display device using a pencil hardness tester in accordance with some embodiments.
Figure 5B:
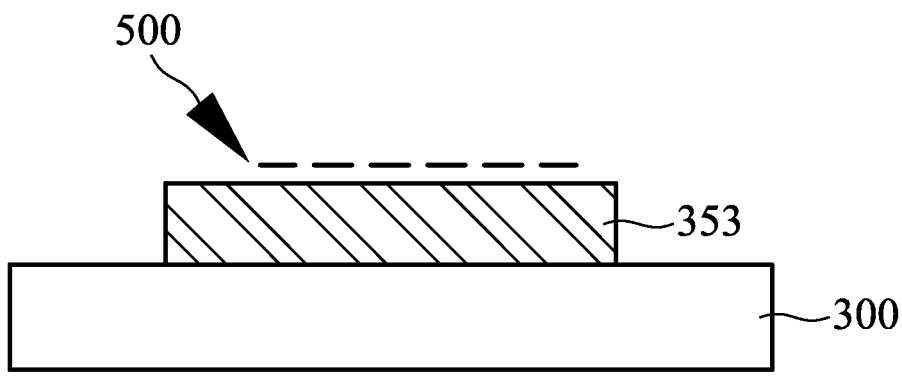
FIG. 5B is a cross-sectional view illustrating an exemplary testing method of a flexible substrate of a display device using a pencil hardness tester in accordance with some embodiments.

FIG. 5A is a cross-sectional view illustrating an exemplary testing method of a supporting film 391 of a display device using a pencil hardness tester in accordance with some embodiments. FIG. 5B is a cross-sectional view illustrating an exemplary testing method of a flexible substrate 353 of the display device using the same pencil hardness tester as FIG. 5A in accordance with some embodiments.

In the pencil hardness test, a pencil is clipped by a holder of the pencil hardness tester and moved on the test object at a constant speed for a horizontal distance. In the present test, the distance is set to 1.3 cm, the holder of the pencil hardness tester is equipped with a 500 g weight, and an inclined angle between the pencil and the test object is set to 45 degrees. Therefore, the pencil can scratch the test object with a steady stress applied on it. The pencil needs to be rotated to another side between each of the tests. After three tests, the pencil should be ground for the next round of tests. By performing the pencil hardness test, the hardness of the sample can be measured by using pencils of different hardness.

As shown in FIG. 5A, a flexible substrate 353 is fixed on a test platform 300, and a supporting film 391 is attached to the flexible substrate 353 by a layer of supporting glue 389 therebetween. The flexible substrate 353, the supporting glue 389 and the supporting film 391 are portions of a display device. A first round of the pencil hardness test is performed on the top surface of the supporting film 391, and a pencil 400 is moved along the top surface of the supporting film 391 with the experiment parameters described above.

Next, referring to FIG. 5B, after performing the pencil hardness on the supporting film 391, the supporting film 391 and the supporting glue 389 are removed, and the flexible substrate 353 is fixed on the test platform 300. A second round of the pencil hardness test is performed on the top surface of the flexible substrate 353, and a pencil 500 is moved along the top surface of the flexible substrate 353 with the experiment parameters described above.

FIG. 6 is the test results of pencil hardness tests on the supporting film 391 and the flexible substrate 353 of the display device in accordance with some embodiments. As shown in FIG. 6, three samples of supporting film and three samples of flexible substrates were tested. The column of NG rate represents the damage rate of the samples during the test of pencil hardness. According to the test result shown in FIG. 6, the hardness of the supporting film is greater than the HB level of pencil hardness, and the hardness of the supporting film is greater than the hardness of the flexible substrate.

By choosing a material for the supporting film which is harder and thicker than the material of the flexible substrate, and choosing a material for the flexible substrate which is more heat-resistant than the material of the supporting film, the supporting film can support the light-emitting diodes during the bonding process and the flexible substrate can bear the heat generated during the manufacturing process of the display device. As a result, the display device may remain undamaged.

Moreover, in order to ensure the bonding between the light-emitting diodes and the conductive pads on the flexible substrate is successful, which means the light-emitting diodes are electrically connected to the conductive pads, some embodiments of the disclosure further provide the shape of the conductive elements between the light-emitting diodes and the conductive pads.

Specifically, when an anisotropic conductive film with conductive particles is used as a conductive element, the conductive particles have a height-width ratio in a range from 35% to 65%. When a first electrode of a light-emitting diode is used as a conductive element, in the cross-sectional view after performing the bonding process, at least a portion of the side of the conductive element adjacent to the conductive pad is in a curved shape, and at least a portion of the side of the conductive pad adjacent to the driving layer is also in a curve shaped. The portion of the side of the conductive element and the portion of the side of the conductive pad are conformal curves.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device, comprising:
   a supporting film;
   a flexible substrate disposed on the supporting film;
   a driving layer disposed on the flexible substrate;
   a conductive pad disposed on the driving layer; and
   a light-emitting diode disposed on the conductive pad and electrically connected to the conductive pad,
   wherein in a cross-sectional view, the conductive pad has a first main surface facing toward the driving layer, and at least a portion of the first main surface is in a shape of a curve; and
   wherein in a cross-sectional view, the driving layer has a second main surface facing toward the flexible substrate, and at least a portion of the second main surface is in a shape of a curve.

2. The display device as claimed in claim 1, wherein the supporting film has a first hardness, and the first hardness is between level 3B and level 3H of pencil hardness.

3. The display device as claimed in claim 1, wherein the supporting film is made of an insulating material.

4. The display device as claimed in claim 1, wherein the supporting film has a first thickness, the light-emitting diode has a second thickness, and the first thickness is greater than the second thickness.

5. The display device as claimed in claim 4, wherein the flexible substrate has a third thickness, and the third thickness is less than the first thickness.

6. The display device as claimed in claim 4, further comprising:
   a supporting glue disposed between the flexible substrate and the supporting film, wherein the supporting glue has a fourth thickness, and the fourth thickness is less than the first thickness.

7. The display device as claimed in claim 4, further comprising:
   a conductive element disposed between the light-emitting diode and the conductive pad,
   wherein the conductive pad has a fifth thickness, the conductive element has a sixth thickness, and the fifth thickness is less than the sixth thickness.

8. The display device as claimed in claim 7, wherein the conductive element comprises an anisotropic conductive film with a plurality of conductive particles, and the conductive particles have a height-width ratio in a range from 35% to 65%.

9. The display device as claimed in claim 7, wherein in a cross-sectional view, the conductive element has a third main surface facing toward the conductive pad, and at least a portion of the third main surface is in a shape of a curve.

10. The display device as claimed in claim 9, wherein the curved portion of the first main surface and the curved portion of the third main surface are conformal.

11. A display device, comprising:
a supporting film;
a flexible substrate disposed on the supporting film;
a driving layer disposed on the flexible substrate;
a conductive pad disposed on the driving layer; and
a light-emitting diode disposed on the conductive pad and electrically connected to the conductive pad,
wherein in a cross-section view, at least a portion of a first interface between the conductive pad and the driving layer is in a shape of a curve; and
wherein in a cross-sectional view, at least a portion of a second interface between the driving layer and the flexible substrate is in a shape of a curve.

* * * * *